United States Patent [19]

Kanno et al.

[11] Patent Number: 4,510,552
[45] Date of Patent: Apr. 9, 1985

[54] DEVICE FOR HOUSING COMMUNICATION CIRCUITS AND EQUIPMENT

[75] Inventors: Takashi Kanno, Yokohama; Akira Oka, Tokyo; Ituo Okamoto, Kawasaki; Kouji Mizushima, Machida; Shinji Oguro, Yokohama, all of Japan

[73] Assignee: Fujitsu Limited, Kawasaki, Japan

[21] Appl. No.: 442,757

[22] Filed: Nov. 18, 1982

[30] Foreign Application Priority Data

Nov. 18, 1981 [JP] Japan .................................. 56-183646
Nov. 19, 1981 [JP] Japan .................................. 56-184361
Nov. 21, 1981 [JP] Japan .................................. 56-186116

[51] Int. Cl.³ .............................................. H05K 1/14
[52] U.S. Cl. ................................. 361/413; 324/158 F; 361/394; 361/395; 361/415
[58] Field of Search ............... 361/415, 413, 393, 394, 361/395; 324/73 PC, 158 F

[56] References Cited

U.S. PATENT DOCUMENTS

| | | | |
|---|---|---|---|
| 3,129,991 | 4/1964 | Schmitz | 324/158 F |
| 3,375,408 | 3/1968 | Buhrendorf et al. | 361/394 X |
| 3,818,283 | 6/1974 | Ward | 361/394 X |
| 3,953,797 | 4/1976 | Berard et al. | 324/158 F |
| 3,993,936 | 11/1976 | Meade et al. | 361/413 |
| 4,047,781 | 9/1977 | DeNigris et al. | 361/415 X |
| 4,230,986 | 10/1980 | Deaver et al. | 361/415 |
| 4,423,466 | 12/1983 | Beun | 361/413 X |
| 4,442,476 | 4/1984 | Lenderding et al. | 361/415 X |
| 4,470,100 | 9/1984 | Rebaudo et al. | 361/415 X |
| 4,477,862 | 10/1984 | Gonzales | 361/413 X |

FOREIGN PATENT DOCUMENTS 2740971 3/1979 Fed. Rep. of Germany ...... 361/415
2504316 3/1982 France .
1574587 9/1980 United Kingdom .

OTHER PUBLICATIONS

Eichhorn et al., Improved Termination Method for Planar Boards, IBM Tech. Disc. Bull., vol. 20, #11B, Apr. 1978, pp. 4704 and 4705.
Cukier et al., Test Unit for Printed-Circuit Cards, IBM Tech. Disc. Bull., vol. 21 #9, pp. 3657 and 3658.
Funkschau, Heft 15, 1975, Francis-Verlag G.m.b.H. Munchen, A. Declerq, G. Wielemans, "Die Vorteile der Modultechnik fur die Produktion von Farbfernsehgeraten" pp. 55–57.

*Primary Examiner*—R. R. Kucia
*Attorney, Agent, or Firm*—Staas & Halsey

[57] ABSTRACT

A housing device for housing communication circuits and equipment which includes a frame which can receive a plurality of printed boards, each printed board comprising a communication circuit and circuit cables disposed along the frame. A test jack testing the circuit is disposed at the front end of each printed board, and a connector, which is connected to a connector mounted on the frame, disposed at the rear end of the printed board. The test jack includes further includes first and second leads within a molded body, the opening of each jack being disposed at the front side of the printed board so that the insertion direction is parallel with the printed board. The first and second loads are formed so that they contact each other in the neck of the jack, separate from each other at the rear side of the jack, and project out of said molded body.

The first lead of the test jack is connected to a circuit formed on the printed board by a pattern printed thereon and the second lead of the test jack is directly connected to one of the circuit cables.

5 Claims, 21 Drawing Figures

DEVICE FOR HOUSING COMMUNICATION CIRCUITS AND EQUIPMENT

BACKGROUND OF THE INVENTION

The present invention relates to a device for housing communication circuits and equipment such as data circuits for transmitting various data, telephone circuits, and facsimile circuits.

A plurality of printed board units which convert data or sounds to transmission signals are housed within a rack of a communication apparatus. Outer main circuit cables which connect the printed board units with units of another communication apparatus and inner distribution cables for supplying power and connecting printed board to the ground or to an alarm line are disposed within the rack. A test jack is mounted on the front end of the printed board so as to test the function of the printed board and to check the connection between the printed board and the circuit cables. It is necessary that the housing or rack of such a communication apparatus be simple in construction to ease assembly and that it occupy only small area.

In prior art housing devices for communication circuits and equipment, all of the circuits formed on the printed board are connected with the outer circuit cables by a backboard. The backboard is attached to the rear face of the rack. Connectors to which the outer cables are connected are mounted on the rear surface of the backboard and are connected to connectors mounted on the front surface of the backboard by patterns printed on the backboard. The printed board, which is inserted into the rack, is connected to the connectors mounted on the front surface of the backboard by connectors mounted on the rear end of the printed board. Such a construction of the prior art necessitates a backboard and a number of connectors which increase the cost of and complicate the structure of the housing device and also complicate assembly of the rack. Also, the reliability of the connections between the circuit of the printed board and the outer cables is decreased due to the existence of the large number of connections.

Wiring patterns which connect the test jack on the front end of the printed board and the connectors on the rear end of the printed board are formed on the printed board. These wiring patterns occupy a space on the printed board, and, therefore, the space for mounting electronic parts or patterns of communication circuits on the printed board is decreased.

The present invention was made giving consideration to the drawbacks of the prior art.

SUMMARY OF THE INVENTION

It is a primary object of the present invention to provide a housing device for housing communication circuits and equipment in which the number of connectors is decreased so as to simplify the structure of and decrease the cost of the device, and to improve the wiring structure of the test jack device.

A housing device for housing communication circuits and equipment, according to the present invention, comprises a frame on which it is possible to mount a plurality of printed boards, each of which comprises a communication circuit, and circuit cables disposed along the frame. A test jack device for testing the circuit is disposed at the front end of the printed board. A connector, which is connected to a connector mounted on the frame, is disposed at the rear end of the printed

2 board. The test jack device comprises jacks, each jack having first and second leads within a molded body. The opening of each jack is disposed at the front side of the printed board so that the insertion direction is parallel with the printed board. The first and second leads are formed so that they contact each other at the neck of the jack, separate from each other at the rear side of the jack, and project out of the molded body. The present invention is characterized in that the first lead of the jack is connected to the circuit formed on the printed board by a pattern printed thereon and in that the second lead of the jack is directly connected to one of the circuit cables. The embodiment of the present invention will now be described with reference to the accompanying drawings.

BRIEF DESCRIPTION OF THE DRAWINGS

FIGS. 15 (a), (b), and (c) are diagrams used to explain the effect of the present invention;

DESCRIPTION OF THE PREFERRED EMBODIMENTS

Figure 1:
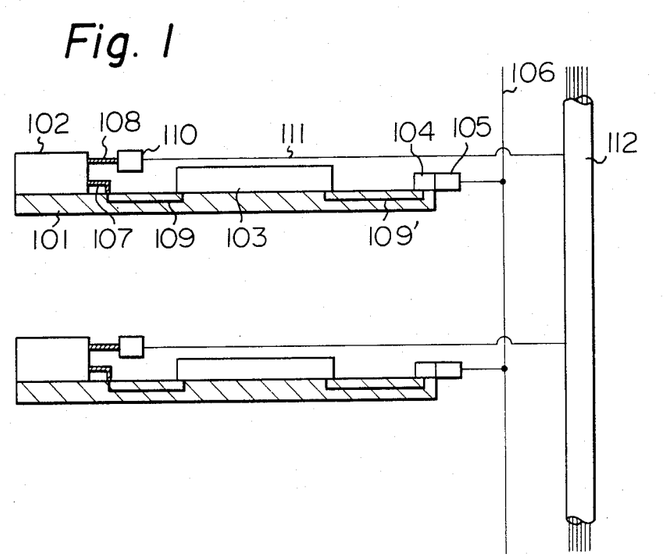
FIG. 1 is a wiring diagram of the housing device according to the present invention.

The wiring arrangement of the housing device according to the present invention is illustrated in FIG. 1. A test jack device 102 is mounted on the front end of a printed board 101. A connector 104 is mounted on the rear end of the printed board 101. The connector 104 is coupled with a connector 105 which is mounted on the rack frame (not shown). The connector 105 is connected to an inner wiring cable 106 which is disposed along the frame. The inner wiring cable 106 comprises electric lines which are common to the printed boards within the rack, such as a power line, a ground line, and an alarm line. The test jack device 102 comprises a first lead 107 and a second lead 108. The first lead 107 is connected to a communication circuit 103, which comprises electronic parts (not shown), by a wiring pattern 109 printed on the printed board 101. The circuit 103 is connected to the connector 104 by a wiring pattern 109' printed on the printed board 101. The second lead 108 is connected to a connector 110, which is attached to an end of an outer cable 111, which deviates from a main cable 112 comprising signal lines connected to a center office or other communication apparatus.

Figure 2:
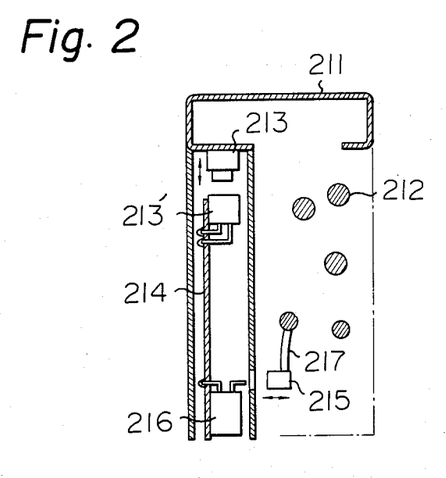
FIG. 2 is a horizontal sectional view of the housing device according to the present invention.

A horizontal section of a housing device according to the present invention is illustrated in FIG. 2. A rack frame 211 extends longitudinally in a direction perpendicular to the drawing. Main cables 212 are disposed along the frame 211. A frame connector 213 is mounted on the frame 211. A unit connector 213', which is coupled to the frame connector 213, is mounted on the rear end of a printed board 214, which constitutes a printed board unit. A test jack device 216 for testing the function of the circuit of the printed board 214 and for checking the connection between the circuit and the outer cables is mounted on the front end of the printed board 214. The test jack device 216 is connected to electronic parts (not shown) on the printed board 214 by the printed pattern (not shown) formed thereon. Also, the test jack device 216 is connected to an outer cable 217 by a cable connector 215 attached to the end of the outer cable 217. A plurality of printed boards 214 are disposd along the frame 211.

Figure 3:
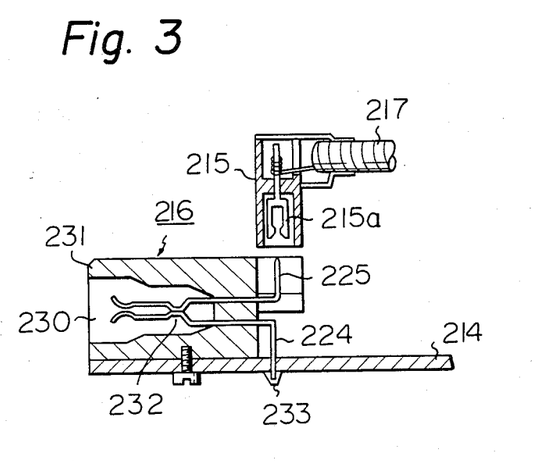
FIG. 3 is a sectional view of a test jack device according to the present invention.
Figure 4:
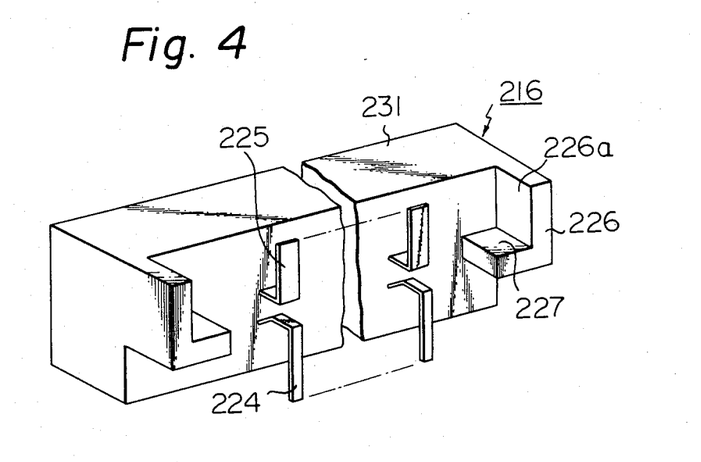
FIG. 4 is a perspective view seen from the rear side of the test jack device of FIG. 3.

The test jack device 216 is illustrated in detail in FIGS. 3 and 4. The test jack device 216 comprises a plurality of jacks 230, each of which comprises a first lead 224 and a second lead 225 within a molded body 231. The opening of the jack 230 is disposed at the front side of the molded body 231. The insertion direction of the jack 230 is parallel to the printed board 214. The first and second leads 224 and 225 contact each other at the neck 232 of the jack 230 and separate from each other at the rear of the jack 230. Both leads 224 and 225 project out of the molded body 231 from the rear side thereof. The first lead 224 is folded toward the printed board 214 so as to be connected to the printed pattern formed thereon. The first lead 224 is easily secured to the printed board by the solder dip method, in which the lower side of the printed board 214 is dipped in melted solder. Reference numeral 233 designates the solder. The second lead 225 is folded upward. A jack 215a of the cable connector 215 is connected to the end of the second lead 225. A guide wall 226 is formed on each side of the rear face of the molded body 231 so as to guide the cable connector 215. The guide wall 226 comprises a guide face 226a and a stop surface 227.

Figure 5:
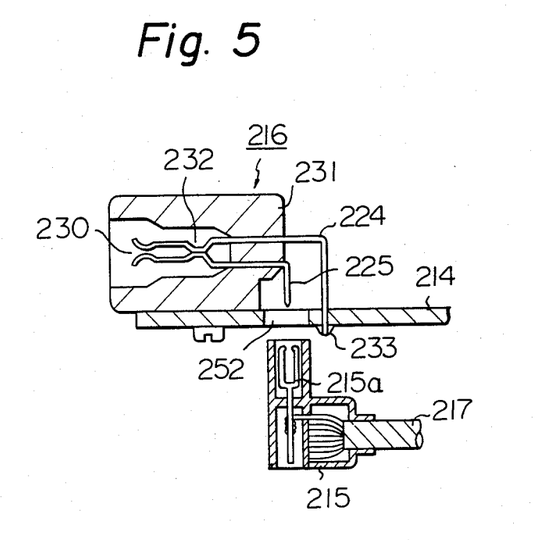
FIG. 5 is a sectional view of another test jack device according to the present invention.
Figure 6:
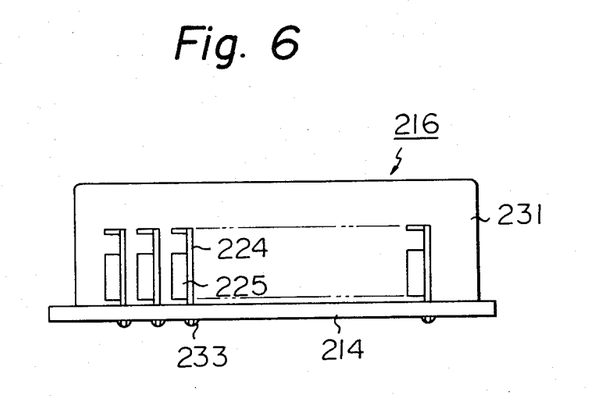
FIG. 6 is a rear view of the test jack device of FIG. 5.
Figure 7:
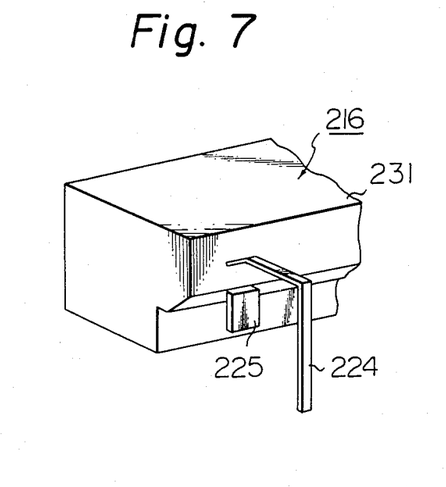
FIG. 7 is a partial perspective view seen from the rear side of the test jack devide of FIG. 5.

Another example of the test jack device according to the present invention is illustrated in FIGS. 5, 6, and 7. The first and second leads 224 and 225 are folded in the same direction, that is, toward the printed board 214. An opening 252 is formed in the printed board 214 for insertion of the cable connector 215 which is attached to the end of the outer circuit cable 217. The tip of the second lead 225 is positioned above the printed board surface so as to avoid wetting of the second lead 225 with solder at the time of soldering by means of the solder dip method.

Figure 8:
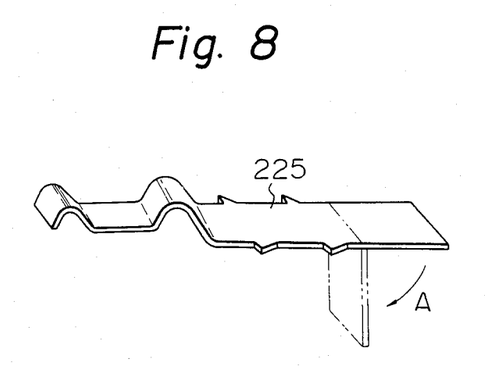
FIG. 8 is a perspective view of a lead used in the test jack device of FIG. 5.

Each of the first and second leads 224 and 225 is punched from a plate, assembled with the molded body 231, and is then folded in the direction of the arrow A in FIG. 8, in which only the second lead 225 is illustrated.

Figure 9:
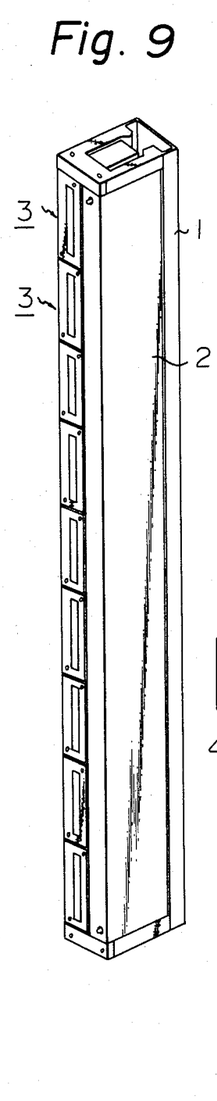
FIG. 9 is an outer view of the housing device according to the present invention.
Figure 10:
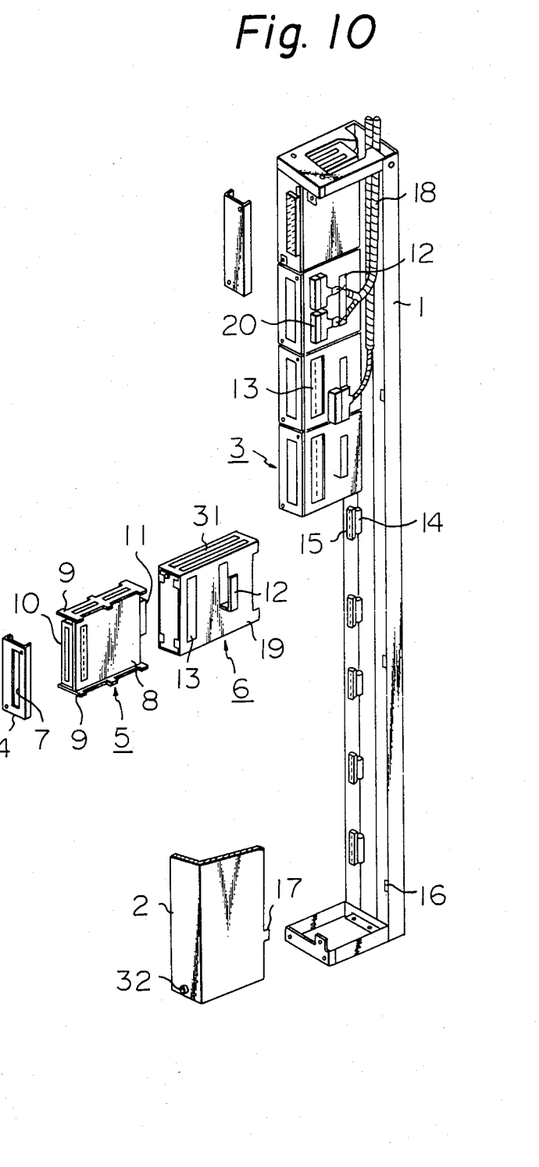
FIG. 10 is an exploded view of the housing device of FIG. 9.

The outer view and the inner view of the housing device according to the present invention are illustrated in FIGS. 9 and 10, respectively. A plurality of printed board units 3 are disposed along a frame 1. The test jack of FIG. 5 is installed in each of the printed board units 3. The printed board units 3 are covered by a cover 2. Each printed board unit 3 comprises a front cover 4, a printed board assembly 5, and a shelf 6, as illustrated in FIG. 10. The front cover 4 has an opening 7 for the insertion of a plug so that a test plug (not shown) can be connected with the test jack device 10. The printed board assembly 5 comprises a printed board 8 held by upper and lower support members 9. The test jack device 10 is mounted on the front end of the printed board 8. A unit connector 11 for connecting the printed board with an inner wiring cable, a flat flexible cable 14, is mounted on the rear end of the printed board 8. The shelf 6 comprises an outer case 19, which has a cable support 12 and an opening 13 on the side surface thereof for the insertion of a cable connector 20 and a ventilation hole 31 on the upper surface thereof. Main circuit cables 18 are disposed along the frame 1. Each main circuit cable 18 is connected to the test jack device 10 by the cable connector 20 through the opening 13. The flat cable 14, which is used as an inner cable, comprises electrical lines common to the printed boards within the rack (housing device), such as a power line, a ground line, and an alarm line. The flat cable 14 is made of a flexible printed board and is disposed along the inside of the frame 1. Frame connectors 15 are attached to the flat cable 14 at predetermined positions corresponding to the positions of the printed board unit 3. A projection 17 of the cover 2 is inserted into a hole 16 in the frame 1 and then the cover is secured to the frame 1 by means of a screw 32.

Figure 11:
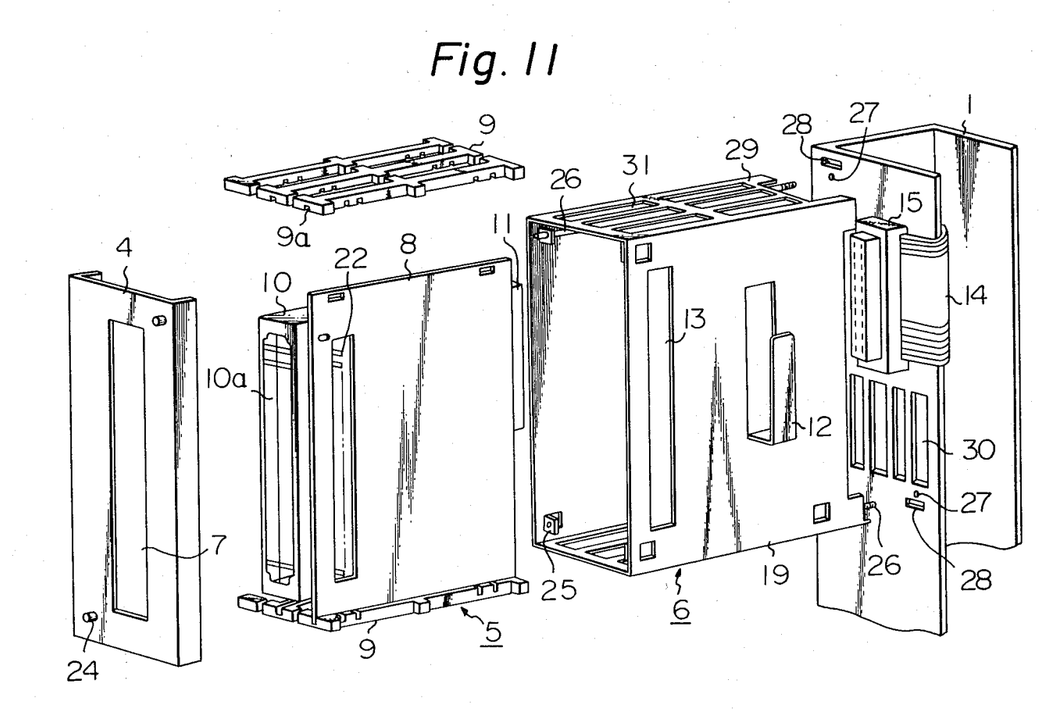
FIG. 11 is an exploded view of a printed board unit according to the present invention.

The printed board unit 3 and the frame 1 of FIG. 10 are illustrated in detail in FIG. 11. The printed board 8 is held in a groove 9a of each support member 9 so as to form a printed board assembly 5. The test jack device 10 has an opening 10a at the front end thereof so as to receive a test plug (not shown). The test jack device 10 has leads 22 to which the cable connector 20 of the outer main cable 18 (FIG. 10) is connected. The printed board assembly 5 is housed in the shelf 6. The shelf 6 is secured to the frame 1 by screwing screw bars 26 into holes 27 of the frame 1. The front cover 4 is secured to the shelf 6 by screwing a screw 24 into a tongue 25 of the shelf 6 at the upper and lower portions thereof. Projections 29 are formed in the rear portion of the shelf 6. Each projection 29 fits into a hole 28 in the frame 1 so as to hold the shelf 6 on the frame 1. Ventilation openings 30 are provided in the frame 1.

Figure 12:
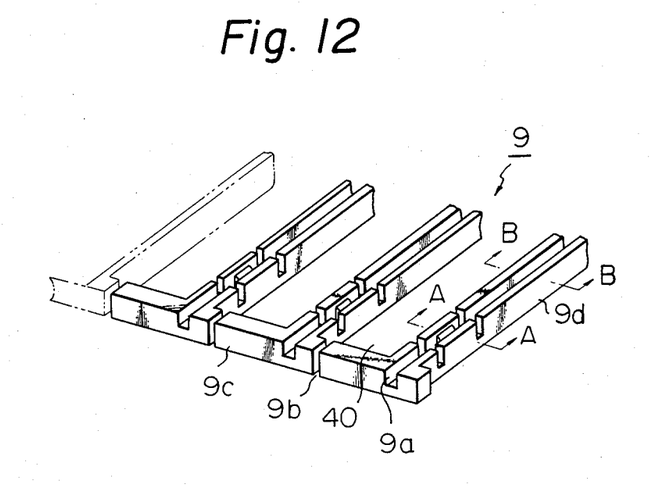
FIG. 12 is a detailed view of the support member used in the printed board unit of FIG. 11.
Figure 13:
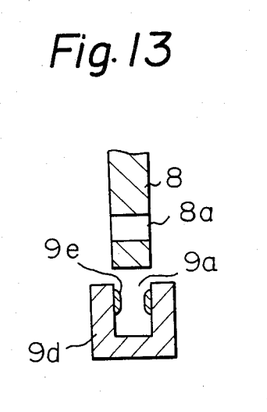
FIG. 13 is a sectional view taken along the arrows A of FIG. 12.
Figure 14:
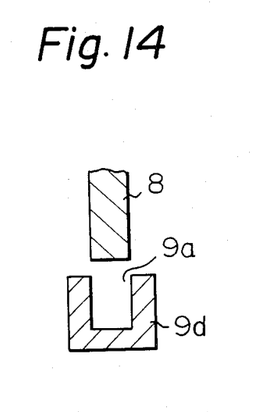
FIG. 14 is a sectional view taken along the arrows B of FIG. 12.

The support member 9 is illustrated in detail in FIG. 12. The support member 9 is molded from plastic material. The upper and the lower support members are identical. The support member 9 comprises frames 9d, each of which has a groove 9a for holding the printed board, and frames 9c which are connected to the frames 9d. A space 40 between the frames 9d serves as a ventilation hole. Notches 9b are provided on the frame 9c for easy cutting of the frame 9c and correspond to the number of printed boards to be housed. A projection 9e is provided on the inside surface of each groove 9a, as illustrated in FIG. 13. The printed board 8 is pushed into the groove 9a, which is elastically widened, and then the projections 9e are secured into an opening 8a of the printed board 8 so that the printed board 8 is securely held by the support member 9.

Figure 15A:
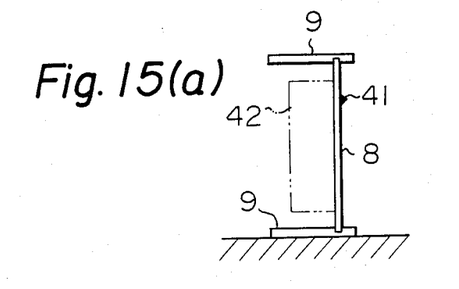
Figure 15B:
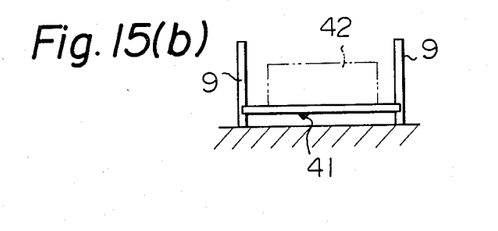
Figure 15C:
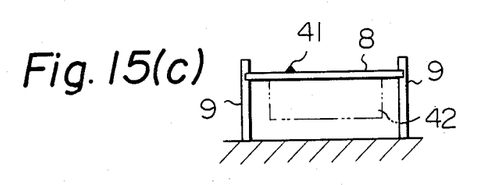

The thickness of the support member 9 in the direction perpendicular to the printed board 8 above its surface is larger than the height of the electronic parts 42 mounted on the surface, as illustrated in FIG. 15. Also, the thickness of the support member 9 above the surface opposite to the surface on which parts are mounted is larger than the height of the solder 41 of the lead of each electronic part. The printed board 8 is stored in the form of a printed board assembly assembled with the support member 9. Therefore, the electronic parts 42 and the lead tip are protected by the support member 9 in any storage position of the assembly, as illustrated in FIGS. 15(a), (b), and (c).

Figure 16:
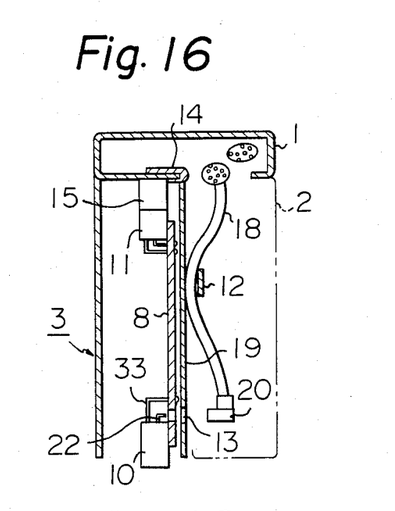
FIG. 16 is a horizontal sectional view of another example of the housing device according to the present invention.
Figure 17:
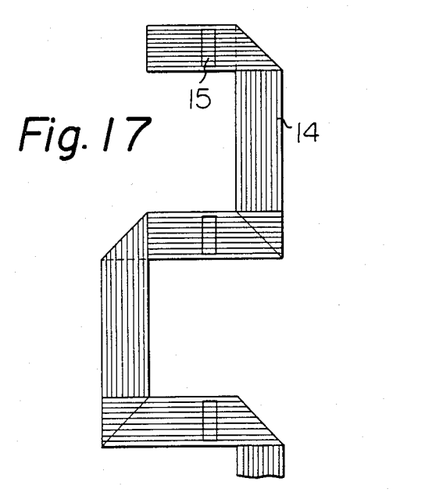
FIG. 17 is a plan view of a float cable disposed along the frame of the rack according to the present invention.

FIG. 16 is a horizontal sectional view of the housing device of FIG. 9. The test jack device 10 has a first lead 33 which is connected to a printed pattern (not shown) formed on the printed board 8 and a second lead 22 which is connected to the cable connector 20 at the end of the outer main circuit cable 18. The unit connector 11 at the rear end of the printed board 8 is coupled with the frame connector 15, which is connected to the flat cable 14 for wiring a power supply line, a ground line, and an alarm line. A plurality of frame connectors 15 can be attached to the flat cable 14 by appropriately folding the flat cable 14, as illustrated in FIG. 17.

Figure 18:
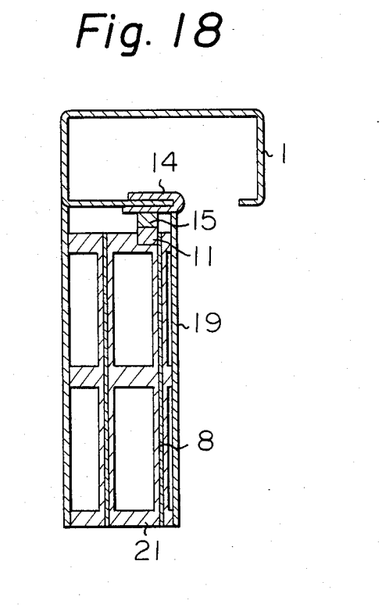
FIG. 18 is a horizontal sectional view of another example of the housing device according to the present invention.
Figure 19:
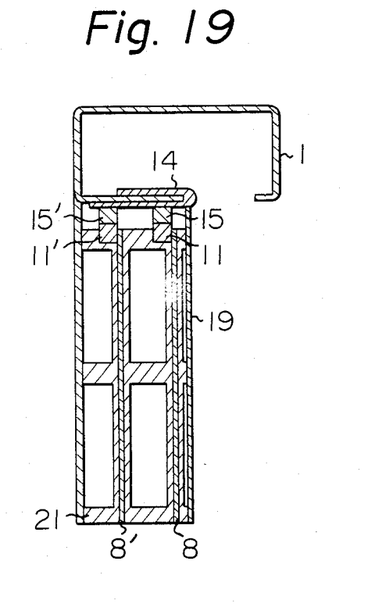
FIG. 19 is a horizontal sectional view of a further example of the housing device according to the present invention.

Other examples of the printed board unit are illustrated in FIGS. 18 and 19. The printed board unit of FIG. 19 comprises two printed boards 8 and 8'. Two frame connectors 15 and 15' are disposed side by side on the flat cable 14. The main cable (not shown) is connected to the test jack device (not shown) of the printed board 8 on the right side thereof. The printed board unit of FIG. 18 comprises one printed board 8.

As mentioned above, the test jack device according to the present invention comprises first and second leads, the first lead being connected to the circuit formed on the printed board and the second lead being directly connected to the main circuit cable so that the circuit on the printed board is connected to the outer main circuit cable by the test jack device. Therefore, patterns for connecting the test jack device and the main cable are not printed on the printed board, with the result that the space for the communication circuit on the printed board is increased and the entire area of the printed board can be effectively used for the communication circuit. The number of connectors between the outer main cable and the printed board is decreased, and the number of connection pins of the unit connector at the rear end of the printed board is also decreased since the unit connector is used to connect the printed board and the inner wiring cable, which does not include outer signal lines. Therefore, the cost of connectors is lowered, the backboard can be omitted, and the construction can be simplified. The reliability of the connection is increased since the number of connectors is decreased. In the embodiment of FIG. 4, alignment of the cable connector and the test jack device is easily and securely achieved because of the guide wall of the molded body. In the embodiment of FIG. 5, the opening 252 of the printed board 214 serves as a guide for the second lead 225.

The printed board is assembled with the molded support member of plastic material before it is housed in the shelf, thereby making it possible to simplify the shelf structure and to easily attach the shelf to the frame. The printed board is easily and securely held by the support member due to the elasticity thereof and does not necessitate the use of bolts or screws. Guide grooves for the printed board are unnecessary in the shelf, thereby making it possible to further simplify the shelf structure. The shelf can be made less stiff since the shelf does not directly hold the printed board. Therefore, a large opening for ventilation can be formed in the shelf, thereby upgrading the efficiency of heat radiation. Also, the printed board is protected by the support member if it is stored without a special protection case.

The use of a flexible flat cable as a distribution cable within the rack makes it possible to omit the backboard and simplify the rack structure. The rack can be easily assembled and be made small. Omission of the backboard makes it possible to form ventilation openings on the frame. Therefore, the frame can be used as a convection passage so as to upgrade the efficiency of heat radiation.

We claim:

1. A device for housing communication circuits formed of a plurality of printed boards, each printed board having a print pattern formed thereon, front and rear ends and a connector disposed at the rear end of the printed board, and equipment, comprising:
    a frame, for receiving the plurality of printed boards, having a plurality of frame connectors mounted thereon, said frame connectors being operatively connected to the connectors of the printed boards;
    a plurality of circuit cables disposed along said frame, each said circuit cable having at least one connector attached thereto;
    a test jack device, for testing the circuit formed on the printed board, disposed at the front end of each of the printed boards, said test jack device including a plurality of jacks, each jack comprising a molded body having first and second leads extending therefrom, front and rear ends and an opening, said opening in said molded body being disposed at the front end of the printed board, said first and second leads being formed so that they are in electrical contact with each other in the opening of the jack and project from said rear end of said molded body, said first lead of said jack being connected to a circuit formed on the printed board by a print pattern printed thereon and said second lead of said jack being directly connected to one of said circuit cables.

2. A device for housing communication circuits and equipment according to claim 1, wherein said first lead of said jack is folded, on the outside of said molded body, toward the printed board, so as to be connected to the pattern printed thereon and wherein said second lead of said jack is folded away from said printed board so as to be directly connected to the connector attached to the end of one of said circuit cables.

3. A device for housing communication circuits and equipment according to claim 1, wherein:
    each printed board has a guide hole through which the cable connector attached to one of said circuit cables is inserted;
    said first lead of said jack is folded, on the outside of said molded body, toward the printed board so as to be connected to the pattern printed thereon;

said second lead of said jack is folded toward the printed board at a position between said molded body and the folded position of said first lead; and the end of said second lead is positioned in front of the guide hole.

4. A device for housing communication circuits and equipment according to claim 1, wherein the printed boards have side edges, a main face, holes formed therein, and circuit elements mounted on the main face thereof, wherein said circuit elements have a height, further comprising a box-like shelf and support members connected to said frame, wherein said support members have grooves which hold each of the side edges of the printed board and a distance between said grooves, the printed board and said support members constituting a printed board assembly which is housed within said boxlike shelf, wherein said distance between said grooves of said support members is larger than said height of said circuit elements and projections are formed on the inside of said groove, wherein the mouth of said grooves is formed of a flexible material and is capable of a resilient widening, so that the printed board can be inserted into said grooves and so that said projections engage the holes formed in the printed board.

5. A housing device for housing communication circuits and equipment according to claim 1, further comprising a flexible flat cable, wherein said frame connectors are connected to each other by said flexible flat cable.

* * * * *